United States Patent
Akiyoshi

(10) Patent No.: US 6,449,194 B1
(45) Date of Patent: Sep. 10, 2002

(54) MULTIPLEXER WITH DUMMY SWITCHES IN NORMALLY OFF STATE TO INCREASE OPERATING SPEED

(75) Inventor: Hideo Akiyoshi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/972,151

(22) Filed: Oct. 9, 2001

(30) Foreign Application Priority Data

Mar. 12, 2001 (JP) .......................... 2001-068062

(51) Int. Cl.$^7$ ............................... G11C 7/00
(52) U.S. Cl. .............. 365/189.02; 365/203; 365/230.02
(58) Field of Search ...................... 365/189.02, 203, 365/230.02, 230.03

(56) References Cited

U.S. PATENT DOCUMENTS 5,034,923 A * 7/1991 Kuo et al. ............. 365/189.01
5,379,259 A * 1/1995 Fujita .................... 365/230.03

* cited by examiner

Primary Examiner—Son Mai
(74) Attorney, Agent, or Firm—Arent Fox Kintner Plotkin & Kahn, PLLC

(57) ABSTRACT

Provided are first to fourth switch circuits of the same configuration as each other, each connected to complementary bus lines DB and *DB to be precharged to the same potential. In the first switch circuit, switches 11 and 15 are connected between an input data signal line SI1 and the DB and between an input data signal line *SI1 and the *DB, respectively, and dummy switches 31 and 32 are connected between the SI1 and the *DB and between the *SI1 and the DB, respectively. Switches 11 to 18 are selectively on/off controlled by outputs of a decoder 20, whereas dummy switches 31 to 38 are normally off.

10 Claims, 8 Drawing Sheets

MULTIPLEXER WITH DUMMY SWITCHES IN NORMALLY OFF STATE TO INCREASE OPERATING SPEED

BACKGROUND OF THE INVENTION

1. Field of the Invention

The present invention relates generally to a precharge type multiplexer with complementary signal input pairs and a complementary signal output pair, more particularly, to a column switch circuit as the multiplexer for use in a memory circuit.

2. Description of the Related Art

FIG. 7 is a schematic circuit diagram of a prior art multiplexer 10. In FIG. 7, an asterisk * added on the head of reference characters of a signal or signal line denotes active low.

The multiplexer 10 is used, for example, as a column select circuit in a memory circuit. In FIG. 7, for simplification, a case is shown in which the multiplexer 10 has a data signal input of 4 bits.

Input signal lines SI1 to SI4 are connected through respective switches 11 to 14 to a data bus line DB, and input data signal lines *SI1 to *SI4 complementary to the input data signal lines SI1 to SI4 are connected through respective switches 15 to 18 to data bus line *DB complementary to the data bus line DB. Each of the switches 11 to 18 is configured such that a PMOS transistor and an NMOS transistor are connected in-parallel to each other. To the gates of the NMOS transistors of the switches 11 to 14, there are connected respective input selection lines C1 to C4 to which outputs of a decoder 20 are provided, while to the gates of the PMOS transistors of the switches 11 to 14, there are connected respective input selection lines *C1 to *C4 complementary to the input selection lines C1 to C4. The decoder 20 turns on a selected pair of switches according to a selection control signal SEL of 2 bits when an output enable signal EN is active.

The data bus lines DB and *DB are connected to the outputs of a charge circuit 21 receiving a precharge signal *PCG which is driven low prior to selection control so that the data bus lines DB and *DB are precharged to the same potential as a logic high of the input data signal. A potential difference between the data bus lines DB and *DB is provided to a sense amplifier circuit 22 to amplify the difference and output as complimentary output signals SO and *SO.

FIG. 8 is a waveform diagram showing operation in a case where the input data signal lines SI1 and *SI1 of FIG. 7 are selected and signals SO and *SO are outputted.

At first, the output enable signal EN is inactive and all of the switches 11 to 18 are off. In this state, the precharge signal *PCG is driven low and the data bus lines DB and *DB are precharged high by the charge circuit 21. In the period of this operation, the input data signals of 4 bits are provided to the multiplexer 10. As shown in FIG. 7, it is assumed that the input data signal lines SI1 and *SI2 to *SI4 are high ('H'), while the input data signal lines *SI1 and SI2 to SI4 are low ('L').

Then, the precharge signal *PCG is driven high to cease the precharge and cause both of the data bus lines DB and *DB to enter into a floating state. On the other hand, the output enable signal EN becomes active and the input selection lines C1 and *C1 are driven high and low, respectively, by the decoder 20 to turn on the switches 11 and 15. Since the input data signal line *SI1 is low, a positive charge moves from the data bus line *DB through the switch 11 to the input data signal line SI1 to lower the potential of the data bus line *DB. In a case of a memory circuit, since resistance and parasitic capacitance of the input data signal lines SI1 to SI4 and *SI1 to *SI4 and the on-resistance of the switches 11 and 18 are comparatively large, a time constant, which is a product of resistance and capacitance, is also comparatively large, thereby the lowering of the potential is gradual.

A sense amplifier drive signal SAD is driven high to activate the sense amplifier circuit 22, and thereby a potential difference between the data bus lines DB and *DB is amplified in the sense amplifier circuit 22 to output as signals SO and *SO. In order to prevent a malfunction of the sense amplifier circuit 22 by noise, the sense amplifier circuit 22 is activated at a time when it is estimated that the potential difference ΔV between the data bus lines DB and *DB has become about 100 mV.

It is possible to speed up the operating speed of a circuit if threshold voltages of all the transistors thereof are lowered.

However, the threshold voltages of the switching transistors 11 to 18 also lowered; therefore leakage current through the switches in an off state increases, and transfer of a positive charge from the data bus line DB of 'H' through the switches 12 to 14 to the input data signal lines SI2 to SI4 of 'L' increases with the result that decrease occurs in the potentials of not only the data bus line *DB but also the data bus line DB. Hence, a time interval from the activation of the output of the decoder 20 to the time point when the potential ΔV reaches about 100 mV becomes longer, and therefore a necessity arise for delaying the start point of activation of the sense amplifier circuit 22, thereby hindering realization of a high-speed operation.

Although there arises variations in potential difference between the data bus lines DB and *DB since the leakage current differs according to the input data of the multiplexer 10, at a design phase, it is required to avoid the malfunction even in the worst condition conceivable; therefore the variations retard higher speed operation.

SUMMARY OF THE INVENTION

Accordingly, it is an object of the present invention to provide a multiplexer capable of reducing variations in potential difference between a pair of complementary data bus lines caused by leakage current flowing through switches in an off state to increase an operating speed.

In one aspect of the present invention, there is provided a multiplexer circuit comprising: a plurality of switch circuits connected to first and second output bus lines to be precharged to the same potential; and a selection control circuit selectively turning on one of the plurality of switch circuits.

Each of the plurality of switch circuits includes: first and second switches, connected between a first input signal line and the first output bus line and between a second input signal line which is complementary to the first input signal line and the second output bus line, respectively, turned on/off by the selection control circuit; and first and second dummy switches, connected between the first input signal line and the second output bus line and between the second input signal line and the first output bus line, respectively, normally tuned off.

With this configuration, if the first and second switches of each switch circuit are off, complementary signals are provided onto the first and second input signal lines of each switch circuit, and the first and second output bus lines are precharged to the same potential, a leakage current flowing between the first output bus line and input signal lines connected to the first output bus line through switches including dummy switches will become almost equal to a leakage current flowing between the second output bus line and input signal lines connected to the second output bus line through switches including dummy switches. Hence, the potential difference between the first and second data bus lines will keep to be almost zero, which is substantially the same as a case of no leakage current to a sense amplifier circuit amplifying this potential difference.

Therefore, when one of the switch circuits is selected by the selection control circuit, almost no influence of leakage current is exerted on the potential difference between the first and second data bus lines. Thereby variations in the potential difference caused by input signal values provided to the multiplexer are prevented, and reduction in the potential difference caused by leakage current is suppressed, resulting in realizing a high speed operation.

Other aspects, objects, and the advantages of the present invention will become apparent from the following detailed description taken in connection with the accompanying drawings.

DESCRIPTION OF THE PREFERRED EMBODIMENTS

Figure 1:
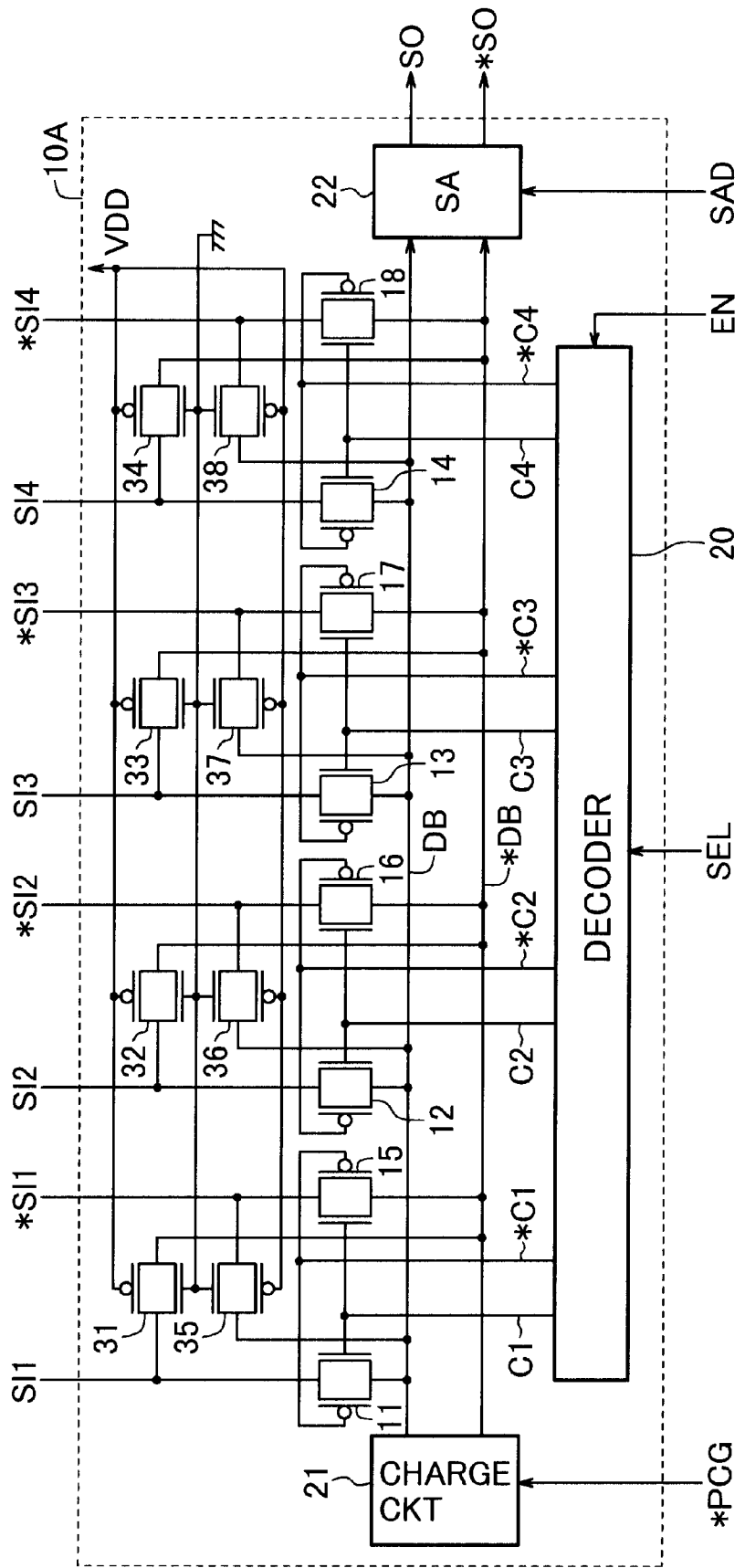
FIG. 1 is a schematic circuit diagram showing a multiplexer of a first embodiment according to the present invention.

Referring now to the drawings, wherein like reference characters designate like or corresponding parts throughout several views, preferred embodiments of the present invention are described below. A signal or signal line which is active low will be denoted by asterisk * added to the head of reference characters.

First Embodiment

FIG. 1 is a schematic circuit diagram showing a multiplexer 10A of a first embodiment according to the present invention.

In the multiplexer 10A, the threshold voltages of all the transistors are set low in order to realize a high-speed operation. Therefore, leakage current flowing through switches in an off state increases as described above.

Further, dummy switches 31 to 34 are connected between respective input data signal lines SI1 to SI4, connected through switches 11 to 14 to a data bus line DB, and a data bus line *DB, and dummy switches 35 to 38 are connected between respective input data signal lines *SI1 to *SI4, connected through switches 15 to 18 to the data bus line *DB, and the data bus line DB.

The gates of a PMOS transistor and an NMOS transistor of each of the dummy switches 31 to 38 are connected to an internal power supply potential VDD and a ground potential GND, respectively, to let the dummy switches 31 to 38 be normally off. Each of the dummy switches 31 to 38 has the same configuration and size so that it has the same operating characteristics as those of each of the switches 11 and 18.

A logic high and low of outputs of a decoder 20 are the internal power supply potential VDD and the ground potential GND, respectively, and each of the dummy switches 31 to 38 in an off state has the same characteristics as those of each of the switches 11 to 18 in an off state.

Figure 7:
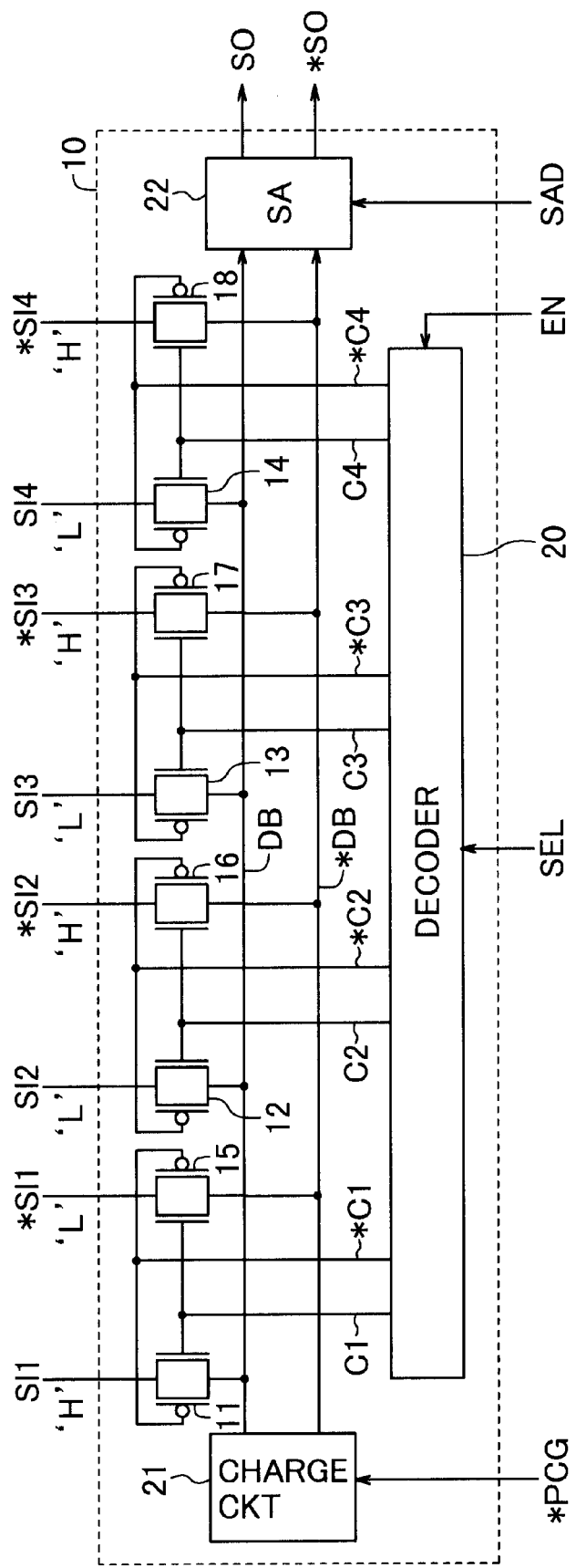
FIG. 7 is a schematic circuit diagram of a prior art multiplexer.

The other points are the same as corresponding those of the multiplexer 10 of FIG. 7.

Figure 2:
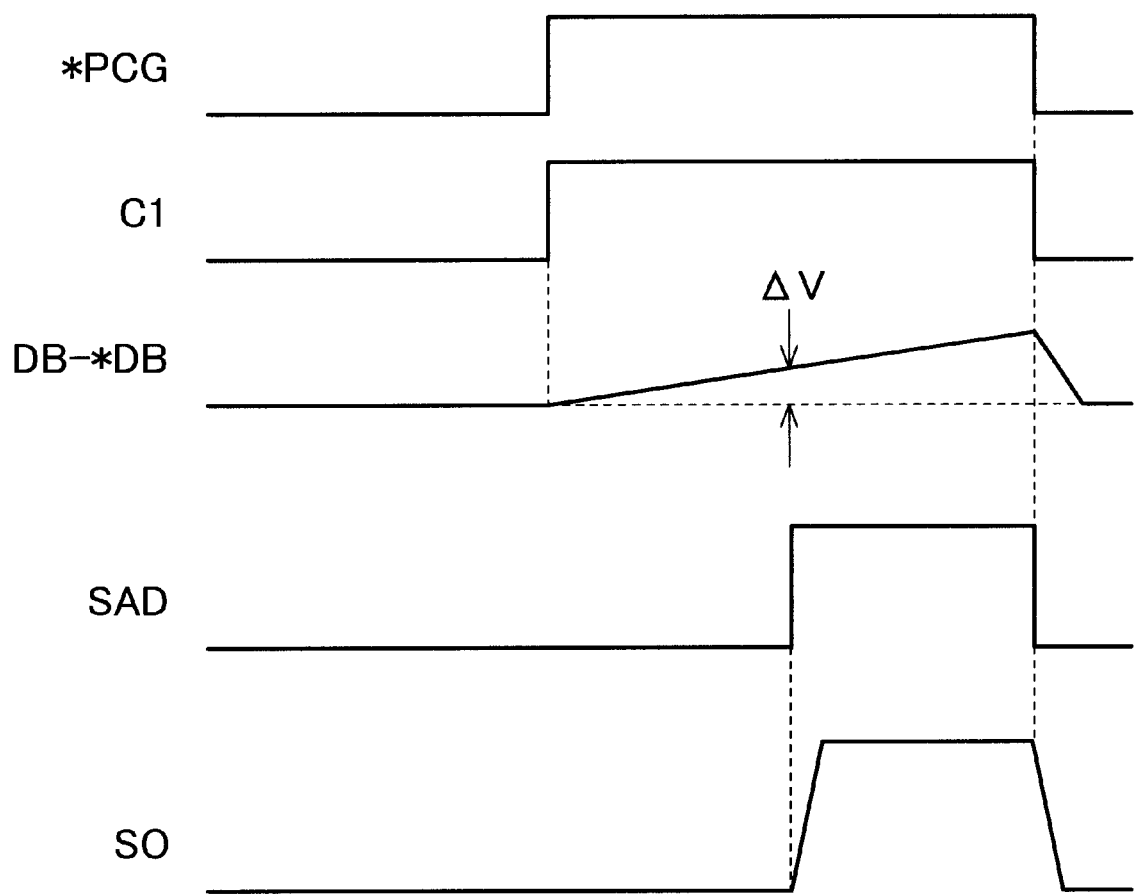
FIG. 2 is a waveform diagram showing operation in a case where input data signal lines SI1 and *SI1 of FIG. 1 are selected.
Figure 8:
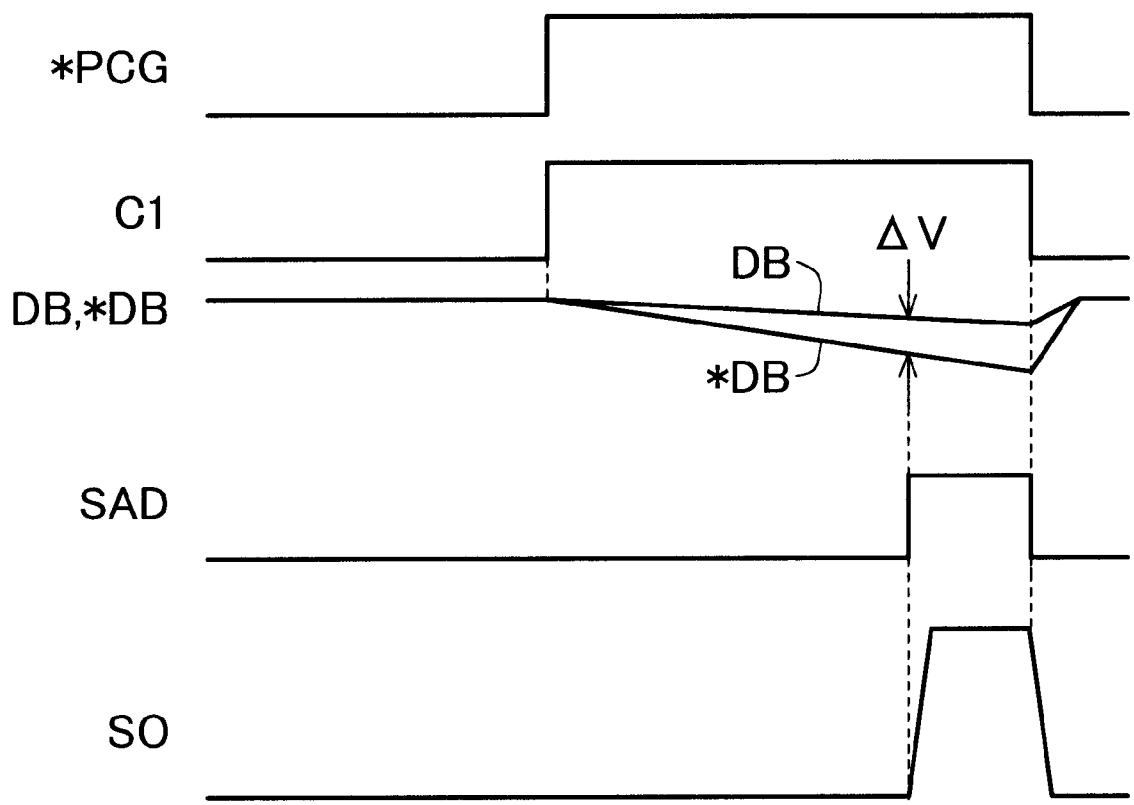
FIG. 8 is a waveform diagram showing operation in a case where the input data signal lines SI1 and *SI1 of FIG. 7 are selected.

FIG. 2 is a waveform diagram, analogous to FIG. 8, showing operation in a case where the input data signal lines SI1 and *SI1 of FIG. 1 are selected to output as signals SO and *SO.

Description will be given of operation in this case below.

At the beginning, an output enable signal EN is inactive and the switches 11 to 18 are all off. At this time, each of the data bus lines DB and *DB is connected to the input data signal lines SI1 to SI4 and *SI1 to *SI4 through switches or dummy switches in an off state. Further, a precharge signal *PCG is low and the data bus lines DB and *DB are precharged high by a charge circuit 21. In the period of this operation, 4 bit data is provided to the multiplexer 10A.

If, in this state, the precharge signal *PCG is driven high to cease the precharge on the data bus lines DB and *DB to cause the data bus lines DB and *DB to enter into a floating state, leakage current will flow from the data bus lines DB and *DB to input data signal lines at a logic low. However, since a leakage current flow from any of the data bus lines DB and *DB through the switches 11 to 18 or dummy switches 31 to 38, both in an off state, to the input data signal lines at a logic low, a leakage current flowing to input lines from the data bus line DB will have the same value as that flowing to input data signal lines from the data bus line *DB, without depending on the value of the 4 bit input data to the multiplexer 10A. Therefore, a potential difference between the data bus lines DB and *DB will keep to be zero, which is the same state as the absence of the leakage current for a sense amplifier circuit 22 amplifying the potential difference.

Next, not only the precharge signal *PCG is driven high to cease precharge, but also the output enable signal EN is activated so that input selection lines C1 and *C1 transit high and low, respectively, by a decoder 20 to turn on the switches 11 and 15. In this state, almost no influence of leakage current is exerted on the potential difference between the data bus lines DB and *DB because of the above-described hypothetical operation.

Thereby, variations in potential difference between the data bus lines DB and *DB caused by the values of the 4 bit input data to the multiplexer 10A are prevented from occurring, and reduction in potential difference between the data bus lines DB and *DB caused by leakage current is also suppressed. Accordingly, as shown in FIG. 2, the sense amplifier circuit 22 can be activated at a timing earlier than that in the prior art, thereby realizing higher speed operation.

The other operation is the same as that described with respect to FIG. 8.

Second Embodiment

Figure 3:
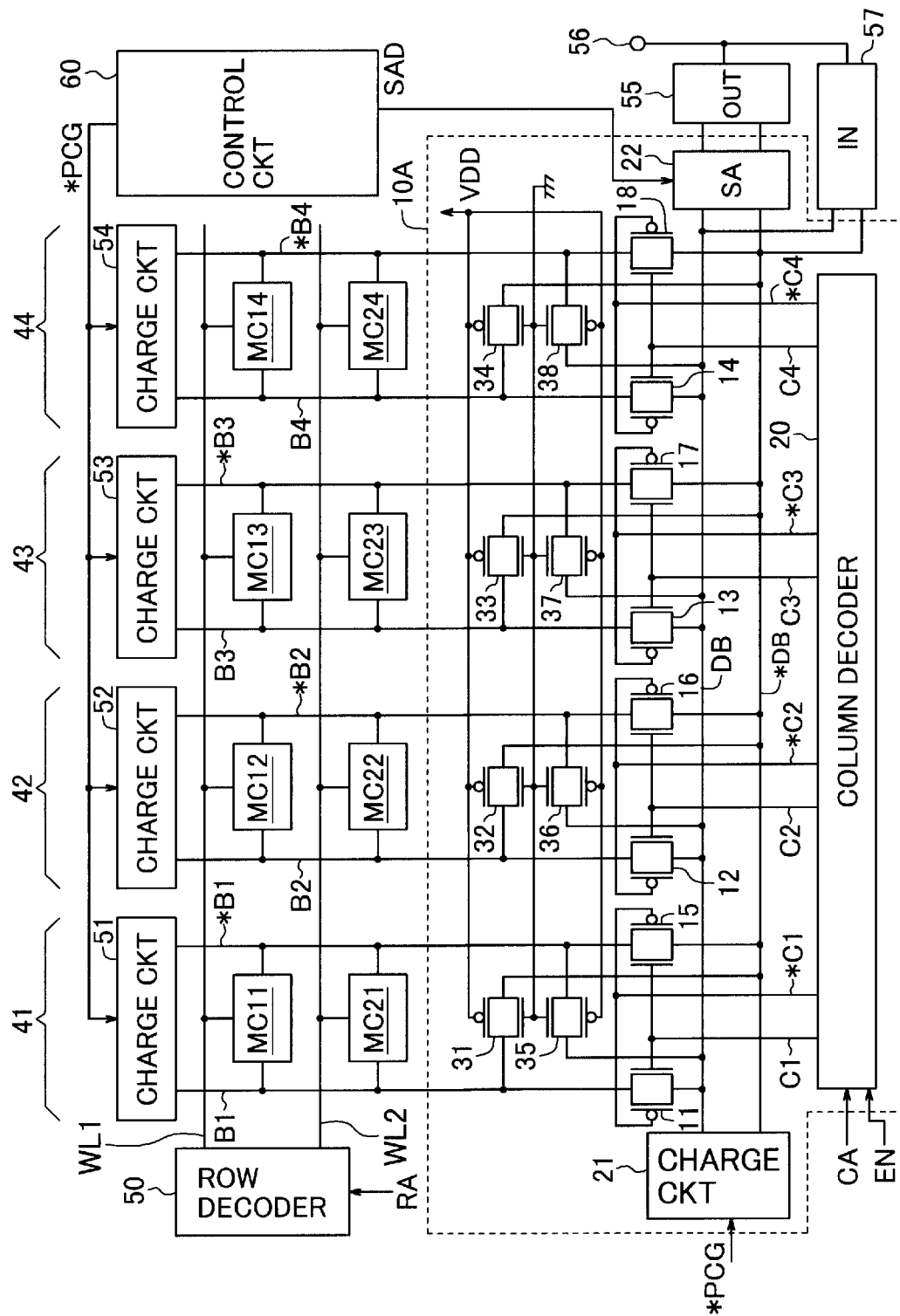
FIG. 3 is a schematic diagram showing an SRAM circuit of a second embodiment according to the present invention employing the multiplexer of FIG. 1.

FIG. 3 is a schematic diagram showing an SRAM circuit of a second embodiment according to the present invention using the multiplexer 10A of FIG. 1.

For simplification, there is shown in FIG. 3 an array of memory cells MC11 to MC14 and MC21 to MC24 with 2 rows and 4 columns. The SRAM circuit is integrated on a semiconductor device such as an SRAM memory device or a microprocessor.

In the SRAM circuit, each of column circuits 41 to 44 is connected to a complementary pair of data bus lines DB and *DB.

In the column circuit 41, the control input end of the memory cell MC11 is connected to a word line WL1, and the first and second data ends thereof are connected to respective bit lines B1 and *B1. The memory cell MC11 outputs complementary potentials from the data ends according to storage contents when the word line WL1 is active. This holds true of the memory cell MC21 in a similar manner to the memory cell MC11 and the control input end thereof is connected to a word line WL2. The word lines WL1 and WL2 are connected to the outputs of a row decoder 50 and one of the outputs thereof is activated according to a value of a row address RA when the row decoder 50 is active. The bit lines B1 and *B1 are connected to the outputs of the charge circuit 51 and prior to the start of access to any memory cell, charged to the same potential as a higher one of the complementary potentials to be outputted from a memory cell.

Bit lines B1 to B4 and *B1 to *B4 and a column address CA corresponds to the input data signal lines SI1 to SI4 and *SI1 to *SI4 and the selection control signal SEL, respectively, of FIG. 1.

Column switches 11 and 15 and dummy column switches 31 and 35 in the multiplexer 10A are constituents of the column circuit 41.

Each of the column circuits 42 to 44 has the same configuration as that of the column circuit 41.

An output circuit 55A latches a logic value of a voltage amplified in the sense amplifier 22, converts it into an external signal level, and provide it to a data input/output 56. The data input/output 56 is further connected to the data bus lines DB and *DB through an input circuit 57 which converts an input logic level to an internal logic level and latches it.

Timings in operation are controlled by a control circuit 60. That is, the control circuit 60 controls, as in the prior art, on and off of charge circuits 51 to 54 of the column circuits 41 to 44, and a charge circuit 21, timings of activation and deactivation of decoders 20 and 50 and the sense amplifier circuit 22, and timings of latch in the output circuit 55 and the input circuit 57.

Figure 4:
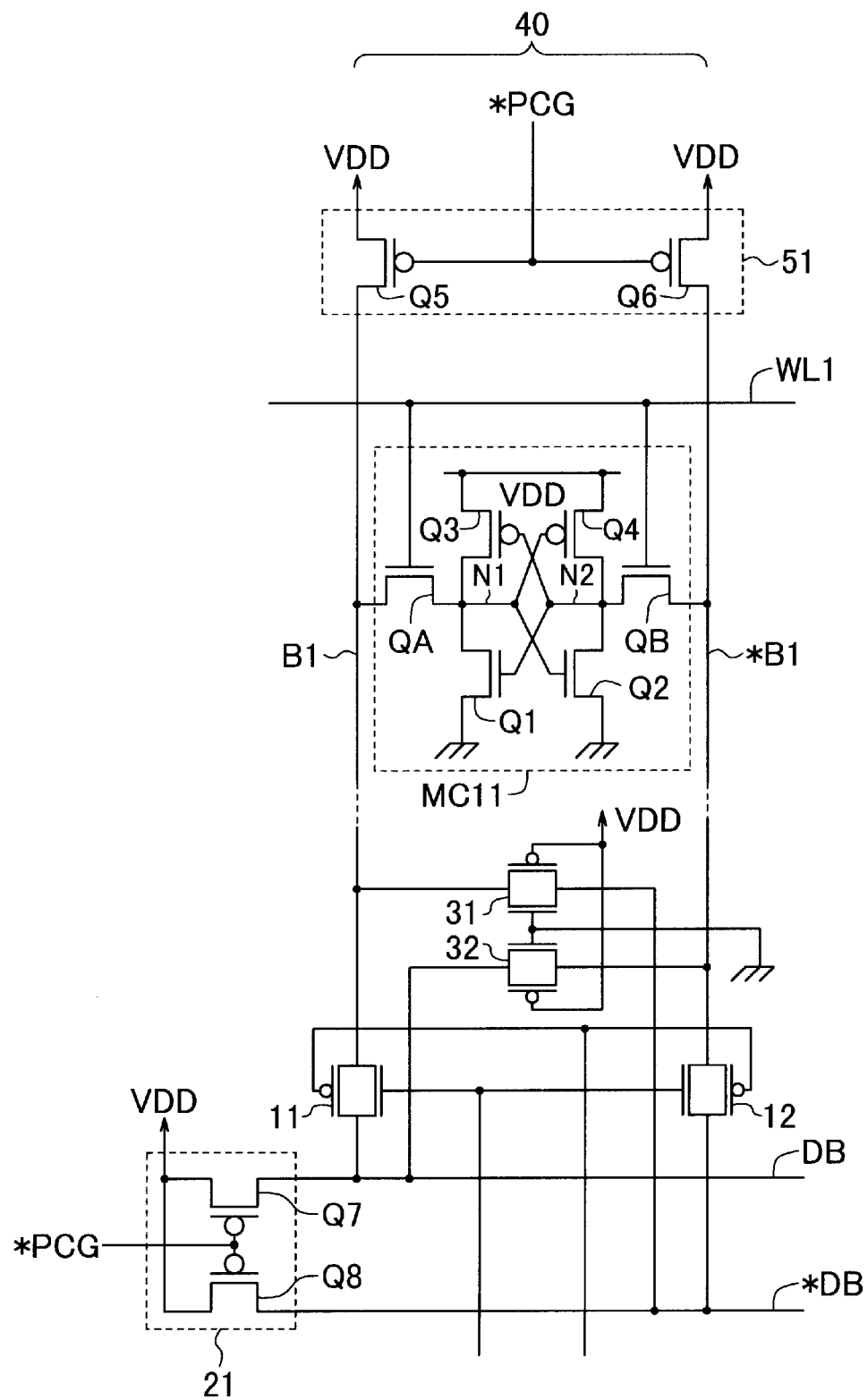
FIG. 4 is a diagram showing a more detailed configuration of the column circuit 41 and the charge circuit 21 of FIG. 3.

FIG. 4 shows a more detailed configuration of the column circuit 41 and the charge circuit 21 of FIG. 3.

The memory cell MC11 is of an SRAM cell with 6 transistors, and nodes N1 and N2 of cross-connected NMOS transistors Q1 and Q2 are connected through cross-connected PMOS transistors Q3 and Q4 to the internal power supply potential VDD on one hand, while being connected to the bit lines B1 and *B1 through NMOS transistors QA and QB, respectively, on the other hand, wherein the gates of the NMOS transistors QA and QB are both connected to the word line WL1.

The bit lines B1 and *B1 are connected to the internal power supply potential VDD through PMOS transistors Q5 and Q6, respectively, of the charge circuit 51, and the precharge signal *PCG from the control circuit 60 of FIG. 3 is provided to the gates of the PMOS transistors Q5 and Q6. In a similar manner, the data bus lines DB and *DB are connected to the internal power supply potential VDD through PMOS transistors Q7 and Q8, respectively, of the charge circuit 21, and the precharge signal *PCG is provided to the gates of the PMOS transistors Q7 and Q8.

Figure 5:
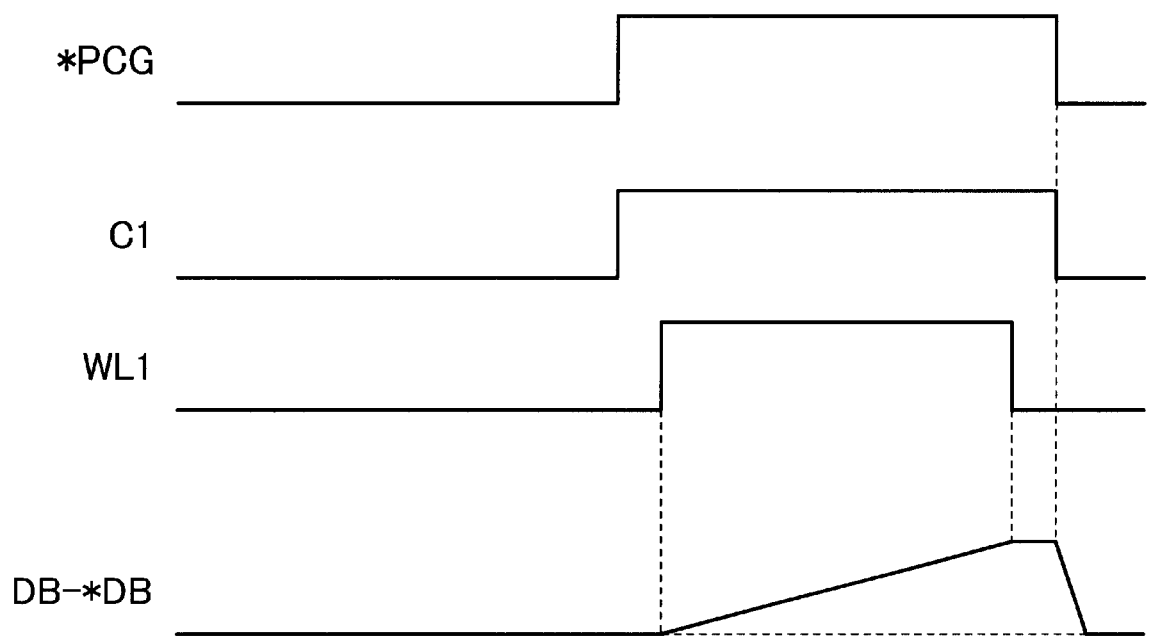
FIG. 5 is a waveform diagram showing operation in a case where the storage contents of a memory cell MC11 of FIG. 3 are read out.

FIG. 5 is a waveform diagram showing operation in a case where storage contents of a memory cell MC11 of FIG. 3 are read out.

Then, description will be given of operation in this case.

In the memory cell MC11, it is assumed that in FIG. 4, the nodes N1 and N2 are high and low, respectively, the PMOS transistors Q3 and Q4 are on and off, respectively, and the NMOS transistors Q1 and Q2 are off and on, respectively.

At first, the decoders 20 and 50 of FIG. 3 are deactivated, the switches 11 to 18 are off, the word lines WL1 and WL2 are low, and the NMOS transistors QA and QB are off. The sense amplifier circuit 22 is inactive as well. Further, the precharge signal *PCG is low and the bit lines B1 to B4 and *B1 to *B4, and the data bus lines DB and *DB are precharged to the internal power supply VDD.

The precharge signal *PCG transits high to cease the precharge and the data bus lines DB and *DB, and the bit lines B1 to B4 and *B1 to *B4 are brought into a floating state. On the other hand, the column decoder 20 is activated, input selection lines C1 and *C1 transits high and low, respectively, to turn on column switches 11 and 15. In this state, since the bit lines B1 to B4 and *B1 to *B4, and the data bus lines DB and *DB are all high, a potential difference between the data bus lines DB and *DB is zero.

Then, the word line WL1 transits high to turn on the NMOS transistors QA and QB of FIG. 4. A positive charge on the bit line *B1 flows to ground through the NMOS transistors QB and Q2 to reduce a potential of the bit line *B1.

This holds true of the memory cells MC12 to MC14 in a similar manner and a potential of one of each bit line pair decreases according to storage contents of a corresponding memory cell.

As described above, since leakage currents flowing from the data bus lines DB and *DB to bit lines through switches in an off state are almost the same in amount, almost no variation arises in potential difference between the data bus lines DB and *DB according to a storage state of memory cells, thereby, enabling the sense amplifier circuit 22 to be activated earlier than in the prior art.

The sense amplifier circuit 22 of FIG. 3 is activated at the time when the potential difference is estimated to have reached 100 mV and the potential difference is amplified to output from the sense amplifier 22. At the output circuit 55, the logic value of the output is latched and the voltage thereof is converted into an external logic level and taken out to the data output 56.

Then, the row decoder 50 is deactivated and the word line WL1 transits low to cut off electrical connections between the memory cells MC11 to MC14 and corresponding bit line pairs.

Then, the column decoder 20 is deactivated to turned off the switches 11 and 15, and further the charge circuits 51 to 54 and 21 are turned on to perform the above described precharge again. Thereby, a potential difference between the data bus lines DB and *DB becomes zero.

According to the second embodiment, the sense amplifier circuit 22 can be activated earlier than in the prior art for the above-described reason, and thereby enabling higher speed memory access to be realized.

Third Embodiment

Figure 6:
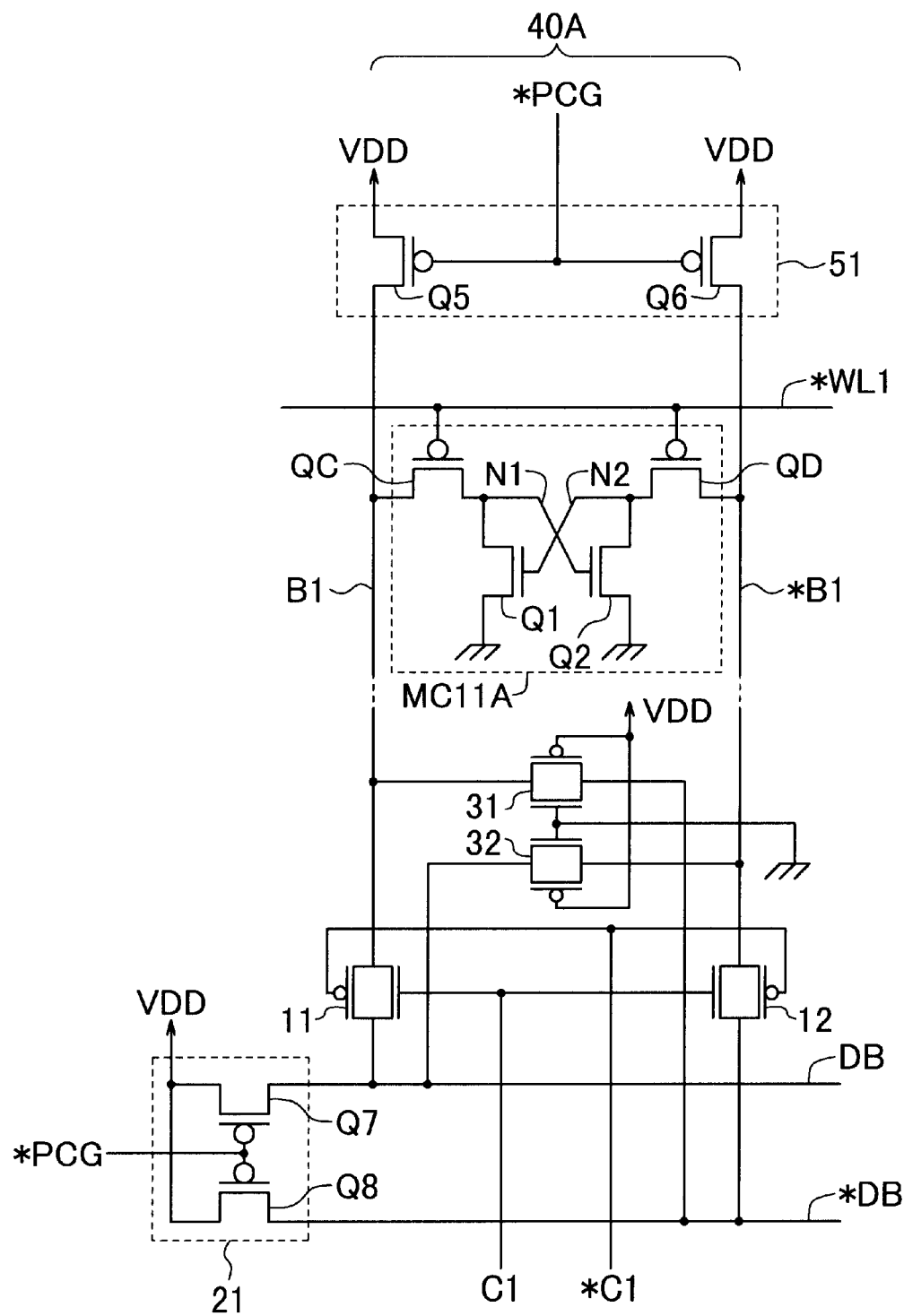
FIG. 6 is a diagram, analogous to FIG. 4, showing a column circuit and the charge circuit of a third embodiment according to the present invention.

FIG. 6 is a diagram, analogous to FIG. 4, showing a column circuit 40A and the charge circuit 21 constituting of a SRAM circuit of a third embodiment according to the present invention.

In the column circuit 40A, an SRAM cell MC11A with 4 transistors is used instead of the SRAM cell MC11 with 6 transistors of FIG. 4, and switches being turned on or off by the potential of a word line *WL1 are constituted of respective PMOS transistors QC and QD.

For example, when the nodes N1 and N2 are high and low, respectively, and the NMOS transistors Q1 and Q2 are off and on, respectively, letting the word line *WL 1 transits be low to turn on the PMOS transistors QC and QD, a positive charge on the bit line *B1 flows to ground through the PMOS transistor QD and the NMOS transistor Q2 to reduce the potential of the bit line *B1. The potential on the node N2 is determined by the potential of the bit line *B1 and the ratio between the on-resistance of the PMOS transistor Q4 and the NMOS transistor Q2, and such a design is performed that the potential of the node N2 is lower than the threshold voltage of the NMOS transistor Q1. Accordingly, the NMOS transistor Q1 keeps an off state.

The other points are the same as those of the above-described first embodiment.

Although preferred embodiments of the present invention has been described, it is to be understood that the invention is not limited thereto and that various changes and modifications may be made without departing from the spirit and scope of the invention.

For example, although description is given of the above embodiments in which memory cells are SRAM cells, the present invention can be applied to all kinds of memory circuits in which switches are connected between a plurality of complementary bit line pairs and one complementary data bus line pair. Further, a multiplexer of the present invention can be applied to various kinds of digital circuits other than memory circuits.

Furthermore, although description is given, in the above described embodiments, of cases where the data bus lines DB and *DB are precharged high, the data bus lines DB and *DB have only to be precharged to the same potential, and the effect of the present invention can be ensured even when the precharge may be performed by a low potential or an intermediate potential between a logic high and a logic low.

Further, the selection control circuit of a multiplexer may be a register or a shift register with a one select bit (for example '1') instead of a decoder.

A switch has only to be one that can be on/off controlled and not limited to FET but may be a bipolar transistor.

What is claimed is:

1. A multiplexer circuit comprising:
a plurality of switch circuits connected to first and second output bus lines to be precharged to the same potential; and
a selection control circuit selectively turning on one of said plurality of switch circuits;
wherein each of said plurality of switch circuits includes:
first and second switches, connected between a first input signal line and said first output bus line and between a second input signal line which is complementary to said first input signal line and said second output bus line, respectively, turned on/off by said selection control circuit; and
first and second dummy switches, connected between said first input signal line and said second output bus line and between said second input signal line and said first output bus line, respectively, normally tuned off.

2. The multiplexer circuit of claim 1, further comprising: a sense amplifier amplifying a potential difference between said first and second output bus lines.

3. A semiconductor device into which a multiplexer circuit is integrated, said multiplexer circuit comprising:
a plurality of switch circuits connected to first and second output bus lines to be precharged to the same potential; and
a selection control circuit selectively turning on one of said plurality of switch circuits;
wherein each of said plurality of switch circuits includes:
first and second switches, connected between a first input signal line and said first output bus line and between a second input signal line which is complementary to said first input signal line and said second output bus line, respectively, turned on/off by said selection control circuit; and
first and second dummy switches, connected between said first input signal line and said second output bus line and between said second input signal line and said first output bus line, respectively, normally tuned off.

4. The semiconductor device of claim 3, further comprising: a sense amplifier amplifying a potential difference between said first and second output bus lines.

5. A memory circuit comprising: a plurality of column circuits connected to first and second data bus lines to be precharged to the same potential, each of said plurality of column circuits including:
a plurality of memory cells each having a control input end connected to a word line to be activated according to a row address, and first and second data ends connected to first and second bit lines, respectively, said first and second data ends providing complementary potentials according to storage contents thereof when said control input end is active;
first and second column switches connected between said first bit line and said first data bus line and between said second bit line and said second data bus line, respectively, said first and second column switches being turned on according to a column address; and
first and second dummy column switches connected between said first bit line and said second data bus line and between said second bit line and said first data bus line, respectively, said first and second dummy column switches being turned off.

6. The memory circuit of claim 5, further comprising: a charge circuit precharging said first and second bit lines of each of said plurality of column circuits and said first and second data bus lines to said same potential before said first and second column switches of selected one of said plurality of column circuits are turned on.

7. The memory circuit of claim 6, wherein said same potential is equal to a higher one of said complementary potentials.

8. The memory circuit of claim 6, wherein said first dummy column switch has a first PMOS transistor and a first NMOS transistor connected in parallel to each other between said first bit line and said second data bus line, and said second dummy column switch has a second PMOS transistor and a second NMOS transistor connected in parallel to each other between said second bit line and said first data bus line.

9. The memory circuit of claim 5, wherein each of said plurality of memory cells comprising:
   a flip-flop having first and second ends having complementary potentials to each other;
   a first switch having a first current path connected between said first end and said first data end, and a first control input end as said control input end of said memory cell; and
   a second switch having a second current path connected between said second end and said second data end, and a second control input end connected to said first control input end.

10. A semiconductor device into which a memory circuit is integrated, said memory circuit comprising: a plurality of column circuits connected to first and second data bus lines to be precharged to the same potential, each of said plurality of column circuits including:
   a plurality of memory cells each having a control input end connected to a word line to be activated according to a row address, and first and second data ends connected to first and second bit lines, respectively, said first and second data ends providing complementary potentials according to storage contents thereof when said control input end is active;
   first and second column switches connected between said first bit line and said first data bus line and between said second bit line and said second data bus line, respectively, said first and second column switches being turned on according to a column address; and
   first and second dummy column switches connected between said first bit line and said second data bus line and between said second bit line and said first data bus line, respectively, said first and second dummy column switches being turned off.

* * * * *